United States Patent
Chang et al.

(10) Patent No.: US 9,806,740 B1
(45) Date of Patent: Oct. 31, 2017

(54) DEVICE AND METHOD FOR DATA COMPRESSION

(71) Applicant: AccelStor, Inc., Taipei (TW)

(72) Inventors: An-Nan Chang, Taipei (TW);
Shih-Chiang Tsao, Taipei (TW);
Pao-Chien Li, Taipei (TW);
Chih-Kang Nung, Taipei (TW)

(73) Assignee: ACCELSTOR, INC., Taipei (TW)

( * ) Notice: Subject to any disclaimer, the term of this patent is extended or adjusted under 35 U.S.C. 154(b) by 0 days.

(21) Appl. No.: 15/653,597

(22) Filed: Jul. 19, 2017

(30) Foreign Application Priority Data

May 5, 2017 (TW) .............................. 106114895 A

(51) Int. Cl.
*H03M 7/30* (2006.01)

(52) U.S. Cl.
CPC ............ *H03M 7/30* (2013.01); *H03M 7/3091* (2013.01); *H03M 7/3053* (2013.01)

(58) Field of Classification Search
CPC .............................. H03M 7/30; H03M 7/3091
USPC ............................................. 341/51, 87, 95
See application file for complete search history.

(56) References Cited

U.S. PATENT DOCUMENTS

| | | | | |
|---|---|---|---|---|
| 6,003,004 A | * | 12/1999 | Hershkovits | G10L 15/02 704/253 |
| 6,292,847 B1 | * | 9/2001 | Nishimoto | G11B 20/10527 710/5 |
| 6,389,006 B1 | * | 5/2002 | Bialik | G10L 19/005 370/352 |
| 7,669,051 B2 | * | 2/2010 | Redlich | C07K 14/70575 713/166 |
| 2002/0159472 A1 | * | 10/2002 | Bialik | H04B 1/7093 370/441 |
| 2008/0168135 A1 | * | 7/2008 | Redlich | G06Q 10/10 709/204 |
| 2009/0276638 A1 | * | 11/2009 | Chen | G06F 1/32 713/300 |

\* cited by examiner

*Primary Examiner* — Lam T Mai
(74) *Attorney, Agent, or Firm* — McClure, Qualey & Rodack, LLP

(57) ABSTRACT

A device for data compression includes a processing unit, a temporary memory, and a storage device. The temporary memory is used to temporarily store data to be compressed. The storage device includes multiple physical blocks. Each physical block has a same volume size. The processing unit compresses the to-be-compressed data, generates compressed data, and stores the compressed data into one of the physical blocks. The processing unit compares a data size of the compressed data and a volume size of one physical block, and when the data size of the compressed data is smaller than the volume size, the processing unit stores remnant data into the same physical block as the compressed data stored in, wherein the total data size of the remnant data plus the compressed data is equal to the volume size of the physical block both are stored in.

12 Claims, 3 Drawing Sheets

DEVICE AND METHOD FOR DATA COMPRESSION

CROSS-REFERENCE TO RELATED APPLICATION

This non-provisional application claims priority under 35 U.S.C. §119(a) to Patent Application No. 106114895 filed in Taiwan, R.O.C. on May 5, 2017, the entire contents of which are hereby incorporated by reference.

BACKGROUND

Technical Field

The present invention is related to a device and a method for data compression.

Related Art

In traditional compression technics, because different files may have different sizes after compression, fragmentation problems may be raised when storing different file compressions with different sizes into a storage device. For example, when a storage device has only two discontinuous storing blocks with 70 k and 80 k respectively, though there is total 150 k volume for storing, an 100 k file compression cannot be stored into the two discontinuous storing blocks. In other words, the two discontinuous storing blocks with 70 k and 80 k are useless for the 100 k file compression, which results in fragmentation.

Additionally, in some other traditional compression technics, one compressed file may be divided into multiple small files for storing in different fragment blocks, respectively. For example, one compressed file with 38 k size is divided into four small files with sizes of 10 k, 10 k, 10 k, and 8 k, respectively. The four divided small files may be stored in four different storing blocks with each 10 k size. However, there is one storing block with 10 k volume storing only 8 k of the divided small file. As a result, 2 k volume of the storing block would be useless, resulting in fragmentation problems.

SUMMARY

In view of the aforementioned problems, the present disclosure provides a device and a method for data compression.

In an embodiment, the device for data compression includes a processing unit, a temporary memory, and a storage device. The temporary memory is used to temporarily store data to be compressed (or named "to-be-compressed data"). The storage device includes multiple physical blocks. Each physical block has a same volume size. The processing unit compresses the to-be-compressed data, generates compressed data, and stores the compressed data into one of the physical blocks. The processing unit compares a data size of the compressed data and a volume size of one physical block, and when the data size of the compressed data is smaller than the volume size, the processing unit stores remnant data into the same physical block as the compressed data stored in, wherein the total data size of the remnant data plus the compressed data is equal to the volume size of the physical block both stored in.

In an embodiment, the physical block stored with the compressed data comprises a field of metadata, and when the data size of the compressed data is smaller than the volume size, the processing unit records a location of the physical block where the remnant data is stored in into the field of the metadata.

In an embodiment, the to-be-compressed data comprises multiple segments of at least one file, and the physical block stored with the compressed data comprises a field of metadata, wherein the processing unit records relevance between the compressed data and the segments into the field of the metadata.

In an embodiment, the to-be-compressed data comprises at least one file with multiple segments, and when the processing unit compresses the to-be-compressed data, the processing unit compares the volume size of the physical block and data sizes of a first quantity of the segments and a second quantity of the segments after compressing, and when the data size of the first quantity of the segments after compressing is smaller than the volume size of the physical block and the data size of the second quantity of the segments after compressing is larger than the volume size of the physical block, the processing unit generates the compressed data according to a third quantity of the segments, wherein the third quantity is between the first quantity and the second quantity.

In an embodiment, the compressed data comprises multiple segments from the same one file or different files, and the processing unit generates the compressed data according to the segments from the same one file or different files.

In an embodiment, a method for data compression comprises: generating compressed data by way of a processing unit according to to-be-compressed data stored in a temporary memory; storing the compressed data into one of multiple physical blocks of a storage device, wherein each physical block has the same volume size; and comparing the data size of the compressed data and the volume size of the physical block; and storing remnant data into the same physical block as the compressed data stored in, wherein the data size of the remnant data plus the data size of the compressed data is equal to the volume size of the physical block.

In an embodiment, when the data size of the compressed data is smaller than the volume size of the physical block, the step of storing the remnant data into the same physical block as the compressed data stored in further comprises: recording a location of the physical block where the remnant data is stored in into a field of metadata.

In an embodiment, the to-be-compressed data comprises multiple segments of at least one file, the step of storing the remnant data into the same physical block as the compressed data stored in further comprises: recording relevance between the compressed data and the segments by way of the processing unit.

In an embodiment, the processing unit generates the compressed data according to the segments from the same one file or different files.

In an embodiment, wherein the to-be-compressed data comprises multiple segments of at least one file, and the step of generating the compressed data by way of the processing unit further comprises: comparing the volume size of the physical block and data sizes of a first quantity of the segments and a second quantity of the segments after compressing; and generating the compressed data by way of the processing unit according to a third quantity when the data size of the first quantity of the segments after compressing is smaller than the volume size of the physical block and the data size of the second quantity of the segments after compressing is larger than the volume size of the physical block, wherein the third quantity is between the first quantity and the second quantity.

As described, according to an embodiment of a device for data compression, each physical block in the storage device has the same volume size. The processing unit may directly store compressed data into a physical block based on data size of the compressed data. Alternatively, compressed data and remnant data both are directly stored in the same physical block to fulfill the storing volume of the physical block. Consequently, the storage device will not have the fragmentation problems.

DETAILED DESCRIPTION

Figure 1:
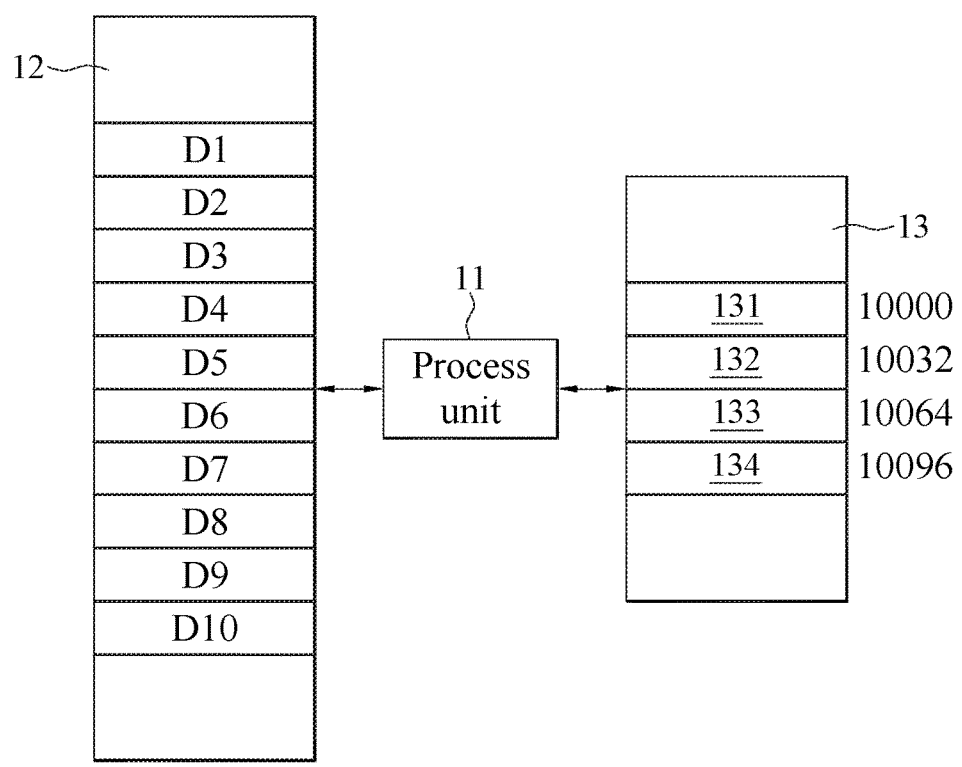
FIG. 1 is a block diagram showing an embodiment of a device for data compression of the instant disclosure.

FIG. 1 is a block diagram showing an embodiment of a device for data compression of the instant disclosure. Please refer to FIG. 1. A device for data compression includes a processing unit 11, a temporary memory 12, and a storage device 13. The processing unit 11 connects to the temporary memory 12 and the storage device 13, respectively. The temporary memory 12 may temporarily store data to be compressed. The temporary memory 12 may be a volatile temporary memory or a register.

The storage device 13 includes multiple physical blocks. As shown in FIG. 1, the physical block 131-134 includes, for example, four physical blocks 131-134. Each one physical block 131, 132, 133 or 134 may store compressed data generated from the processing unit 11. In an embodiment, each physical block 131, 132, 133 or 134 has a same volume size and corresponds to a physical address. For example, when each one physical block 131, 132, 133, and 134 has 4 kilobytes volume size, the corresponding physical address may be, by using the hexadecimal notation, "10000", "10032", "10064", and "10096", respectively.

In an embodiment, the storage device 13 may be a solid state disk (SSD). The smallest unit for physical storing in the SSD is called "page". Each one physical block 131, 132, 133 or 134 includes at least one page. For example, one physical block 131, 132, 133 or 134 may include one page or eight pages. If one page has 4 kilobytes volume size, then one physical block may include 4 kilobytes or 32 kilobytes volume size. Alternatively, the storage device 13 may be a traditional hard disk drive (HHD) having read/write head(s). The smallest unit for physical storing in the HHD is called "sector". In this example, each physical block 131, 132, 133 or 134 includes at least one sector. For example, one physical block 131, 132, 133 or 134 may include one sector or four sectors. If one sector has 0.5 kilobytes volume size, then one physical block may include 0.5 kilobytes or 2 kilobytes volume size.

The processing unit 11 may be a CPU or a MCU. The processing unit 11 may execute instruction(s) for compression. When executing the instruction(s) for compression, the processing unit 11 receives data to be compressed from the temporary memory 12, compresses the to-be-compressed data, and generates compressed data. The data size of the compressed data is smaller than or equal to the volume size of the physical block 131, 132, 133 or 134. The processing unit 11 compares the data size of the compressed data and the volume size of every physical block 131-134. When the data size of the compressed data is smaller than the volume size of any of the physical blocks 131-134, the compressed data cannot completely fulfill any of the physical blocks 131-134. The processing unit 11 stores remnant data into the physical block 131, 132, 133, or 134 along with the compressed data which data size is smaller than the volume size of the physical block. The remnant data is not the data to be compressed. The total data size of the compressed data and the remnant data will be same as the volume size of the physical block 131, 132, 133, or 134. In another way, when the data size of the compressed data is same as the volume size of any of the physical block 131-134, the compressed data completely fulfills the physical block 131, 132, 133, or 134. Consequently, the processing unit 11 directly stores the compressed data in any of the physical blocks 131-134.

For example, the volume size of the physical block 131, 132, 133, or 134 is 4 kilobytes, and the data size of the compressed data generated by the processing unit 11 is 3 kilobytes. For instance, the processing unit 11 stores the compressed data into the physical block 132. Additionally, the processing unit 11 stores 3 kilobytes data size of the compressed data and 1 kilobytes data size of the remnant data into the physical block 132. Consequently, the physical block 132 is fulfilled with the remnant data and the compressed data without remaining volume. That is, the total data size of the remnant data and the compressed data is same as the volume size of the physical block 132. In another example, when the data size of the compressed data generated by the processing unit 11 is 4 kilobytes, the processing unit 11 directly stores the 4 kilobytes data size of the compressed data into the physical block 132 without the remnant data. The physical block 132 is completely fulfilled with only the compressed data. In an embodiment, the remnant data may be any number. Taking digital signal as an example, each bit of the remnant data may be logic "0".

Even though the compressed data may have different data sizes, when the processing unit 11 storing different sizes of the compressed data into the physical block 131, 132, 133, and/or 134, it would not have the fragmentation problem.

In one embodiment, the data to be compressed stored in the temporary memory 12 includes multiple segments of at least one file. The processing unit 11 sequentially generates multiple compressed data according to a part of the segments. In details, the processing unit 11 first takes a part of the segments and then generates compressed data according to a bit relevance of the part of the segments. The processing unit 11 further takes another part of the segments and generates another compressed data according to a bit relevance of aforementioned another part of the segments. Please refer to FIG. 1. For example, the processing unit 11 may first take five segments D1-D5 and them generates the first compressed data according to a bit relevance of the five segments D1-D5. Next, the processing unit 11 may take three segments D6-D8 and then generates the second compressed data according to a bit relevance of the three segments D6-D8. The processing unit 11 may further take two segments D9-D10 and then generates the third compressed data according to a bit relevance of the two segments D9-D10. In this example, it may save time for the processing unit 11 to take all segments and generate the compressed data. In other words, the processing unit 11 may first take a part of the segments and generate the compressed data, which doesn't need to generate all compressed data for all segments. Consequently, it may save the total compression time.

Additionally, when storing each compressed data into the storage device 13, the processing unit 11 obtains a corresponding physical address of each compressed data according to a mapping table, so as to store every compressed data into corresponding physical blocks. The following description takes the three aforementioned compressed data as an example. After the first compressed data is generated, the processing unit 11 stores the first compressed data into the physical block 131 which physical address is "10000" according to the mapping table. After the second compressed data is generated, the processing unit 11 stores the second compressed data into the physical block 134 with the physical address "10096" according to the mapping table. After the third compressed data is generated, the processing unit 11 stores the third compressed data into the physical block 132 which physical address is "10032" according to the mapping table.

Additionally, the processing unit 11 decides quantity of segments according to volume size of a physical block so as to generate a proper size of compressed data. That is, the data size of each compressed data is smaller than or equal to the volume size of each physical block. A first quantity, such as three, is picked as the first example. For example, when the processing unit 11 picks three segments D1-D3 to be pressed and pre-determines that data size (such as 2 kilobytes) of the compressed data is much smaller than the volume size (such as 4 kilobytes) of the physical block, the processing unit 11 picks another quantity as the second quantity, such as six, that is larger than the first quantity. For example, when the processing unit 11 picks six segments D1-D6 to be pressed and pre-determines that data size of the compressed data is larger than the volume size of the physical block, the processing unit 11 picks the other quantity as the third quantity, such as five, that is between the first quantity and the second quantity. Again, when the processing unit 11 picks five segments D1-D5 to be pressed and pre-determines that data size of the compressed data is smaller than or equal to the volume size of the physical block, the processing unit 11 generates the first compressed data according to the five segments D1-D5. Similarly, the second compressed data and the third compressed data may be generated by picking and pre-determination procedure same as above. The size data of the first compressed data, the second compressed data, and the third compressed data are smaller than or equal to the second compressed data, respectively.

In practice, when the processing unit 11 stores the remnant data into the physical block (such as the physical block 131), the processing unit 11 also records the location of the physical block 131 where the remnant data is stored, in which the location is included in "remnant data information". For example, the remnant data locates in the first bit to the 492th bit of the physical block 131. The remnant data information is corresponding to metadata of the compressed data, and the processing unit 11 records the remnant data information into a field of the metadata of the physical block 131. Consequently, a decompression module of the processing unit 11 or other device may distinguish the compressed data and the remnant data according to the remnant data information recorded in the field of the metadata of the physical block 131. Additionally, when the remnant data information is recorded in the same physical block with the corresponding compressed data, it may save a record of a location for the remnant data information. There is no need to record the location of the remnant data information corresponding to the compressed data, because the remnant data information corresponding to the compressed data can be obtained from the same physical block stored with the compressed data and the corresponding remnant data information. For example, when the first compressed data and the corresponding remnant data information both are stored into the physical block 131, the processing unit 11 may obtain the first compressed data and also obtain the corresponding remnant data information from the field of metadata of the physical block 131. This saves storing space when recording the location of the remnant data information corresponding to the compressed data, wherein the compressed data may be compressed by different method in different format.

In one embodiment, after the processing unit 11 takes a part of the segments, the processing unit 11 compresses the segments containing more of "0" so as to generate the compressed data with smaller data size. When the data size of the compressed data is smaller than the volume size of the physical block, the processing unit 11 supplementally stores the remnant data or other metadata (as being replacement of the remnant data) to fulfill the physical block. The data size of the compressed data plus the data size of the metadata is closer to or equal to the volume size of the physical block.

Figure 2:
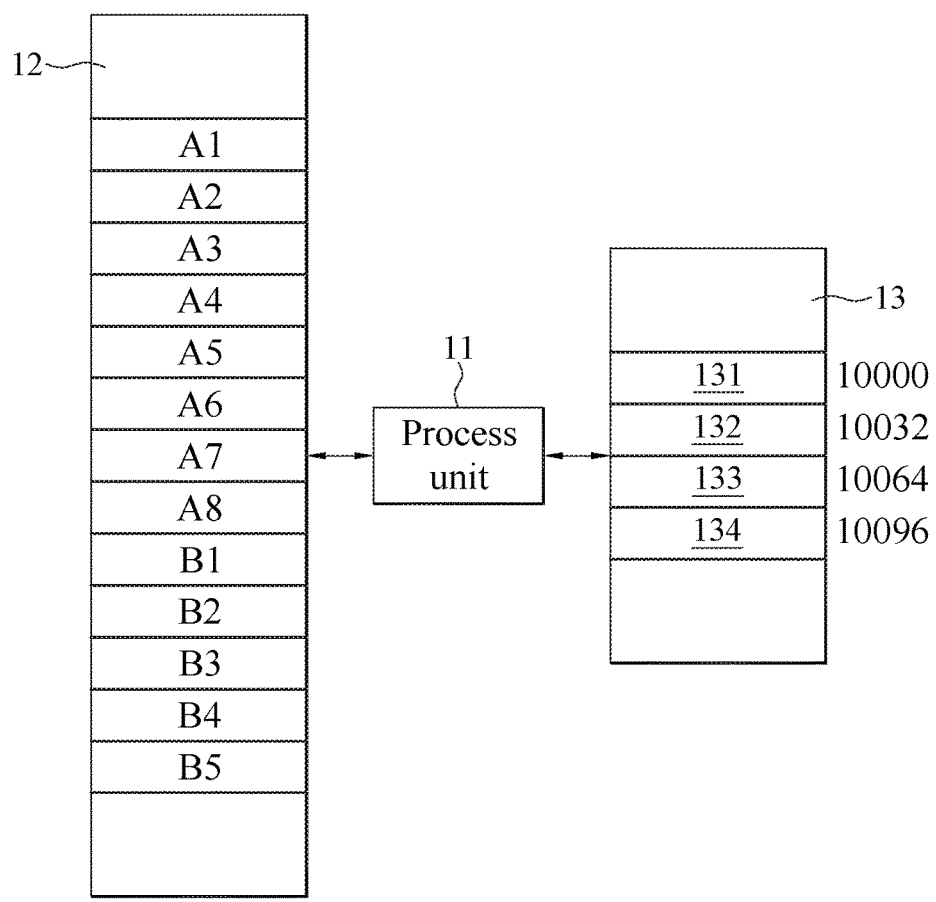
FIG. 2 is a block diagram showing the first embodiment of the device for data compression of FIG. 1.

FIG. 2 is a block diagram showing the first embodiment of the device for data compression of FIG. 1. In the first embodiment, the processing unit 11 compresses the segments all from the same file into the same compressed data. The segments from different files may be compressed into different compressed data. In other words, when the processing unit 11 picks the quantity of the segments for compression, it may be limited to where the segments are from. As shown in FIG. 2, for example, the temporary memory 12 temporarily stores eight segments A1-A8 for a file A and five segments B1-B5 for a file B, wherein the file A and file B are two different files. The segments A1-A5 will be compressed into a data size with 4 kilobytes, and the segments A6-A8 will be compressed into a data size with 2.2 kilobytes. After the processing unit 11 generates compressed data (named first compressed data in below) according to the segments A1-A5, data to be compressed in the temporary memory 12 includes segments A6-A8 and segments B1-B5. The processing unit 11 will not mix any one of the segments A6-A8 and any one of the segments B1-B5 for compression, even though the compressed data size of the segments A6-A8 is smaller than 4 kilobytes. The processing unit 11 generates one compressed data (named second compressed data in below) according to the segments A6-A8 and another compressed data according to the segments B1-B5.

Figure 3:
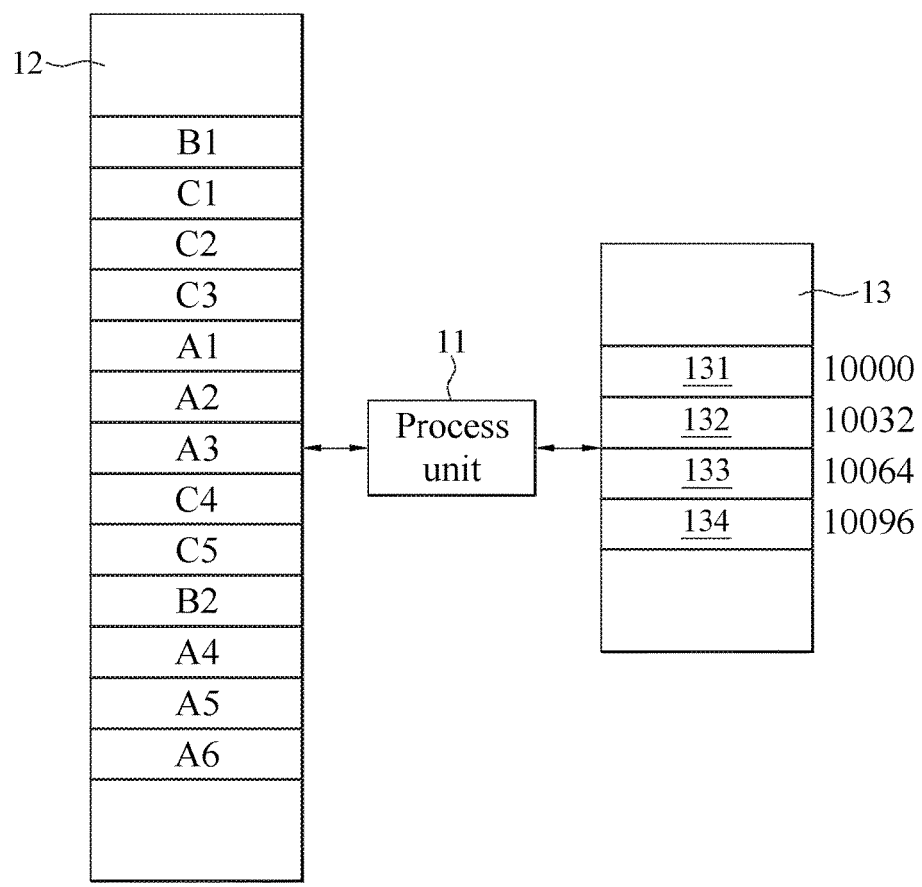
FIG. 3 is a block diagram showing the second embodiment of the device for data compression of FIG. 1.

FIG. 3 is a block diagram showing the second embodiment of the device for data compression of FIG. 1. In the second embodiment, the processing unit 11 compresses segments from different files into the same one compressed data. In this embodiment, when the processing unit 11 picks the quantity of the segments for compression, it will not be limited to whether the segments are from the same one file. As shown in FIG. 3, for example, the temporary memory 12 temporarily stores to-be-compressed data including segments A1-A6 from file A, segments B1-B2 from file B, and segments C1-C5 from file C. The processing unit 11 picks a proper quantity of segments which are from different files for compression to generate compressed data corresponded to different files. For example, processing unit 11 may generate compressed data (named third compressed data in below) according to segments B1, C1-C3, and A1-A3 and another compressed data (named forth compressed data in below) according to segments C4-C5, B2, and A4-A6. Comparing to the first embodiment, it is more flexible for the processing unit 11 to pick segments. The data size of the compressed data (generated by the processing unit) is much closer to the volume size of the physical block, which may reduce the total quantity of remnant data in the storage device 13.

In one embodiment, to-be-compressed data in the temporary memory 12 are from the storage device 13. When the processing unit 11 executes instruction for compression, the processing unit 11 accesses the storage device 13 for reading data. The processing unit 11 copies to-be-compressed data from the storage device 13 to the temporary memory 12. The temporary memory 12 processes in a queue characterized by first in first out (FIFO). Therefore, when the processing unit 11 stores the to-be-compressed data into the temporary memory 12, it is required to consider an order for the segments from different files.

In the first embodiment, the processing unit 11 first reads the file A in the storage device 13 and then reads the file B in the storage device 13. The processing unit 11 first stores segments A1-A8 into the temporary memory 12 and then stores segments B1-B5 into the temporary memory 12. As shown in FIG. 2, segments A1-A8 and B1-B5 are stored in the temporary memory 12 in an order. The temporary memory 12 outputs the segments A1-A8 and B1-B5 according to the same order. Consequently, the processing unit 11 may generate compressed data according to segments from the same file. That is, a first compressed data is generated according to segments A1-A5, a second compressed data is generated according to segments A6-A8, and the other compressed data is generated according to segments B1-B5.

In the second embodiment, the processing unit 11 reads files in the storage device 13 with an order of file B, file C, file A, file C, file B, and file A. The processing unit 11 stores segments in an order of B1, C1, C2, C3, A1, A2, A3, C4, C5, B2, A4, A5, A6 into the temporary memory 12. As shown in FIG. 3, each segment of data is in the order stored in the temporary memory 12. The temporary memory 12 outputs the segments B1, C1, C2, C3, A1, A2, A3, C4, C5, B2, A4, A5, A6 according to the same order.

Consequently, the processing unit 11 may generate compressed data according to segments from the different file. That is, a third compressed data is generated according to segments B1, C1-C3, A1-A3 and a fourth compressed data is generated according to segments C4-C5, B2, A4-A6. In the first embodiment, the processing unit 11 doesn't need to read the file A and the file B repeatedly, whereas it does need to repeatedly read the file A and the file B in the second embodiment. Consequently, it may save the processing unit 11 searching and reading time in the storage device 13 when compressing the segments from the same file into the same compressed data.

In one embodiment, the processing unit 11 needs to record relevance between compressed data and segments for file(s) to be compressed, wherein the relevance is another metadata of the compressed data. The processing unit 11 may further record the relevance into a field of the metadata. In the first embodiment, the processing unit 11 requires recording a first compressed data corresponding to segments A1-A5 of file A and a second compressed data corresponding to segments A6-A8 of file A. A decompression module may recompress the first compressed data and the second compressed data into the file A. In the second embodiment, the processing unit 11 requires recording a third compressed data corresponding to segments B1, C1-C3, A1-A3 and a fourth compressed data corresponding to segments C4-C5, B2, A4-A6. A decompression module may recompress the third compressed data and the fourth compressed data into the files A, B, and C.

In one embodiment, the volume size of the temporary memory 12 for storing is limited. Before the temporary memory 12 stores the to-be-compressed data, the processing unit 11 compares data size of the to-be-compressed data and the volume size of the temporary memory 12. When the data size of the to-be-compressed data is larger than the volume size of the temporary memory 12, the processing unit 11 stores the to-be-compressed into the storage device 13 and will not copy nor move the to-be-compressed data from the storage device 13 to the temporary memory 12. When the volume size of the temporary memory 12 is larger than or equal to the data size of the to-be-compressed data, the processing unit 11 copies or moves the to-be-compressed data from the storage device 13 to the temporary memory 12 by combining using the technics of in-line compression and off-line compression.

In one embodiment, for example, the storage device 13 includes the file A. The processing unit 11 records a location of the file A stored in the storage device 13 on a table. After the processing unit 11 generates the compressed data based on the file A and stores the compressed data into the storage device 13, the processing unit 11 will revise the table for the location of the file A stored in the storage device 13 according to a location of the compressed data stored in the storage device 13. For example, before the compressed data is generated, the physical addresses of the file A stored in the physical block are "20026", "20032", "20148". When the processing unit 11 generates compressed data according to the file A and stores the compressed data into physical block 132, the processing unit 11 revises the table for the physical addresses of the file A of "20026", "20032", "20148" into "10032", wherein the location of the file A stored on the storage device 13 refers to the physical address of "10032".

As described, according to an embodiment of a device for data compression, each physical block in the storage device has the same volume size. The processing unit may directly store compressed data into a physical block based on data size of the compressed data. Alternatively, compressed data and remnant data both are directly stored in the same physical block to fulfill the storing volume of the physical block. Consequently, the storage device will not have the fragmentation problems.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A device for data compression comprising:
   a temporary memory storing to-be-compressed data;
   a storage device comprising multiple physical blocks, and each physical block having same volume size; and
   a processing unit compressing the to-be-compressed data, generating compressed data, and storing the compressed data into one of the physical blocks; wherein the processing unit compares a data size of the compressed data and a volume size of one physical block, and when the data size of the compressed data is smaller than the volume size, the processing unit stores remnant data into the same physical block as the compressed data stored in, wherein the total data size of the remnant data plus the compressed data is equal to the volume size of the physical block both stored in.

2. The device according to claim 1, wherein the physical block stored with the compressed data comprises a field of metadata, and when the data size of the compressed data is smaller than the volume size, the processing unit records a location of the physical block where the remnant data is stored in into the field of the metadata.

3. The device according to claim 1, wherein the to-be-compressed data comprises multiple segments of at least one file, and the physical block stored with the compressed data comprises a field of metadata, wherein the processing unit records relevance between the compressed data and the segments into the field of the metadata.

4. The device according to claim 1, wherein the to-be-compressed data comprises at least one file with multiple segments, when the processing unit compresses the to-be-compressed data, the processing unit compares the volume size of the physical block and data sizes of a first quantity of the segments after compressing, and compares the volume size of the physical block and data sizes of a second quantity of the segments after compressing, and when the data size of the first quantity of the segments after compressing is smaller than the volume size of the physical block and the data size of the second quantity of the segments after compressing is larger than the volume size of the physical block, the processing unit generates the compressed data according to a third quantity of the segments, wherein the second quantity is greater than the first quantity, and the third quantity is between the first quantity and the second quantity.

5. The device according to claim 1, wherein the compressed data comprises multiple segments from the same one file or different files, the processing unit generates the compressed data according to the segments from the same one file or different files.

6. The device according to claim 1, wherein the to-be-compressed data is stored in the storage device before storing into the temporary memory, when a volume size of the temporary memory is equal to or larger than a data size of the to-be-compressed data, the processing unit stores the to-be-compressed data into the temporary memory from the storage device, and the processing unit generates the compressed data according to the to-be-compressed data stored in the temporary memory.

7. A method for data compression comprising:
generating compressed data by way of a processing unit according to to-be-compressed data stored in a temporary memory;
storing the compressed data into one of multiple physical blocks of a storage device, wherein each physical block has the same volume size; and
comparing the data size of the compressed data and the volume size of the physical block; and
storing remnant data into the same physical block as the compressed data stored in, wherein the data size of the remnant data plus the data size of the compressed data is equal to the volume size of the physical block.

8. The method according to claim 7, when the data size of the compressed data is smaller than the volume size of the physical block, the step of storing the remnant data into the same physical block as the compressed data stored in further comprising:
recording a location of the physical block where the remnant data is stored in into a field of metadata.

9. The method according to claim 7, wherein the to-be-compressed data comprises multiple segments of at least one file, the step of storing the remnant data into the same physical block as the compressed data stored in further comprising:
recording relevance between the compressed data and the segments by way of the processing unit.

10. The method according to claim 7, wherein the processing unit generates the compressed data according to the segments from the same one file or different files.

11. The method according to claim 7, before the step of generating the compressed data by way of the processing unit according to the to-be-compressed data stored in the temporary memory, the method further comprising:
comparing data size of the compressed data and a volume size of the temporary memory by way of the processing unit;
storing the to-be-compressed data into the storage device by way of the processing unit when the data size of the to-be-compressed data is larger than the volume size of the temporary memory; and
storing the to-be-compressed data into the temporary memory from the storage device by way of the processing unit when the to-be-compressed data is smaller or equal to the volume size of the temporary memory.

12. The method according to claim 7, wherein the to-be-compressed data comprises multiple segments of at least one file, and the step of generating the compressed data by way of the processing unit further comprising:
comparing the volume size of the physical block and data sizes of a first quantity of the segments after compressing;
comparing the volume size of the physical block and data sizes of a second quantity of the segments after compressing; and
generating the compressed data by way of the processing unit according to a third quantity when the data size of the first quantity of the segments after compressing is smaller than the volume size of the physical block and the data size of the second quantity of the segments after compressing is larger than the volume size of the physical block, wherein the second quantity is greater than the first quantity, and the third quantity is between the first quantity and the second quantity.

* * * * *